United States Patent
Miki et al.

(10) Patent No.: US 9,318,507 B2
(45) Date of Patent: Apr. 19, 2016

(54) THIN FILM TRANSISTOR AND DISPLAY DEVICE

(71) Applicant: Kobe Steel, Ltd., Kobe-shi (JP)

(72) Inventors: Aya Miki, Kobe (JP); Shinya Morita, Kobe (JP); Hiroshi Goto, Kobe (JP); Hiroaki Tao, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/416,213

(22) PCT Filed: Aug. 30, 2013

(86) PCT No.: PCT/JP2013/073372
§ 371 (c)(1),
(2) Date: Jan. 21, 2015

(87) PCT Pub. No.: WO2014/034873
PCT Pub. Date: Mar. 6, 2014

(65) Prior Publication Data
US 2015/0206978 A1    Jul. 23, 2015

(30) Foreign Application Priority Data

Aug. 31, 2012 (JP) .................................. 2012-192666
Apr. 26, 2013 (JP) .................................. 2013-094087

(51) Int. Cl.
*H01L 29/51*    (2006.01)
*H01L 27/12*    (2006.01)
(Continued)

(52) U.S. Cl.
CPC .......... *H01L 27/1225* (2013.01); *H01L 29/408* (2013.01); *H01L 29/51* (2013.01);
(Continued)

(58) Field of Classification Search
CPC ............ H01L 29/7869; H01L 29/1225; H01L 29/02554
USPC .......................................................... 257/43
See application file for complete search history.

(56) References Cited

U.S. PATENT DOCUMENTS 8,558,382 B2    10/2013    Maeda et al.
8,907,334 B2    12/2014    Miki et al.
(Continued)

FOREIGN PATENT DOCUMENTS

CN    102610618 A    7/2012
JP    2007 63649    3/2007
(Continued)

OTHER PUBLICATIONS

Written Opinion of the International Searching Authority Issued Oct. 8, 2013 in PCT/JP13/073372 Filed Aug. 30, 2013.
(Continued)

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

Provided is a thin film transistor comprising an oxide semiconductor thin film layer and has a threshold voltage that does not change much due to light, a bias stress or the like, thereby exhibiting excellent stress stability. A thin film transistor of the present invention is provided with: a gate electrode; two or more oxide semiconductor layers that are used as a channel layer; an etch stopper layer for protecting the surfaces of the oxide semiconductor layers; a source-drain electrode; and a gate insulator film interposed between the gate electrode and the channel layer. The metal elements constituting an oxide semiconductor layer that is in direct contact with the gate insulator film are In, Zn and Sn. The hydrogen concentration in the gate insulator film, which is in direct contact with the oxide semiconductor layer, is controlled to 4 atomic % or less.

6 Claims, 1 Drawing Sheet

(51) Int. Cl.
  *H01L 29/786* (2006.01)
  *H01L 29/40* (2006.01)
  *H01L 21/02* (2006.01)

(52) U.S. Cl.
  CPC ...... *H01L29/7869* (2013.01); *H01L 29/78606*
  (2013.01); *H01L 21/0217* (2013.01); *H01L*
  *21/02126* (2013.01); *H01L 21/02164* (2013.01);
  *H01L 21/02274* (2013.01)

(56) References Cited

U.S. PATENT DOCUMENTS

| | | |
|---|---|---|
| 2004/0191530 A1 | 9/2004 | Inoue et al. |
| 2009/0197757 A1 | 8/2009 | Fukushima |
| 2009/0308635 A1 | 12/2009 | Yano et al. |
| 2009/0321732 A1 | 12/2009 | Kim et al. |
| 2010/0155717 A1* | 6/2010 | Yano et al. ............ 257/43 |
| 2010/0170696 A1 | 7/2010 | Yano et al. |
| 2010/0244029 A1 | 9/2010 | Yamazaki et al. |
| 2010/0276685 A1 | 11/2010 | Itagaki et al. |
| 2010/0314618 A1 | 12/2010 | Tanaka et al. |
| 2011/0121244 A1 | 5/2011 | Yano et al. |
| 2011/0140095 A1 | 6/2011 | Kim et al. |
| 2011/0147736 A1* | 6/2011 | Miyanaga et al. ............ 257/43 |
| 2011/0193083 A1 | 8/2011 | Kim et al. |
| 2012/0001168 A1 | 1/2012 | Ichijo et al. |
| 2012/0032730 A1 | 2/2012 | Koyama |
| 2012/0056176 A1* | 3/2012 | Yamazaki ............ 257/43 |
| 2012/0119207 A1 | 5/2012 | Goto et al. |
| 2012/0181533 A1* | 7/2012 | Yoo et al. ............ 257/43 |
| 2013/0009111 A1 | 1/2013 | Morita et al. |
| 2013/0119324 A1 | 5/2013 | Morita et al. |
| 2013/0181218 A1 | 7/2013 | Maeda et al. |
| 2013/0228926 A1 | 9/2013 | Maeda et al. |
| 2013/0234081 A1 | 9/2013 | Goto et al. |
| 2013/0240802 A1 | 9/2013 | Miki et al. |
| 2013/0248855 A1 | 9/2013 | Miki et al. |
| 2013/0248858 A1 | 9/2013 | Morita et al. |
| 2013/0270109 A1 | 10/2013 | Morita et al. |
| 2013/0306469 A1 | 11/2013 | Kanamaru et al. |
| 2013/0313110 A1 | 11/2013 | Iwasaki et al. |
| 2013/0334039 A1 | 12/2013 | Goto et al. |
| 2013/0341183 A1 | 12/2013 | Goto et al. |
| 2013/0341617 A1 | 12/2013 | Tao et al. |
| 2014/0054588 A1 | 2/2014 | Maeda et al. |
| 2014/0319512 A1 | 10/2014 | Maeda et al. |

FOREIGN PATENT DOCUMENTS

| | | |
|---|---|---|
| JP | 2008 63214 | 3/2008 |
| JP | 2009 164393 | 7/2009 |
| JP | 2010 16347 | 1/2010 |
| JP | 2010 287735 | 12/2010 |
| JP | 2011 108873 | 6/2011 |
| JP | 2011 129926 | 6/2011 |
| JP | 2011 146692 | 7/2011 |
| JP | 2012 26039 | 2/2012 |
| JP | 2012 33913 | 2/2012 |
| JP | 2012 99661 | 5/2012 |
| JP | 2012 151443 | 8/2012 |
| TW | 201208079 A1 | 2/2012 |
| TW | 201232787 A1 | 8/2012 |
| WO | 03 008661 | 1/2003 |
| WO | 2007 037191 | 4/2007 |
| WO | WO 2012/090490 A1 | 7/2012 |

OTHER PUBLICATIONS

International Search Report issued Oct. 8, 2013 in PCT/JP13/073372 Filed Aug. 30, 2013.

* cited by examiner

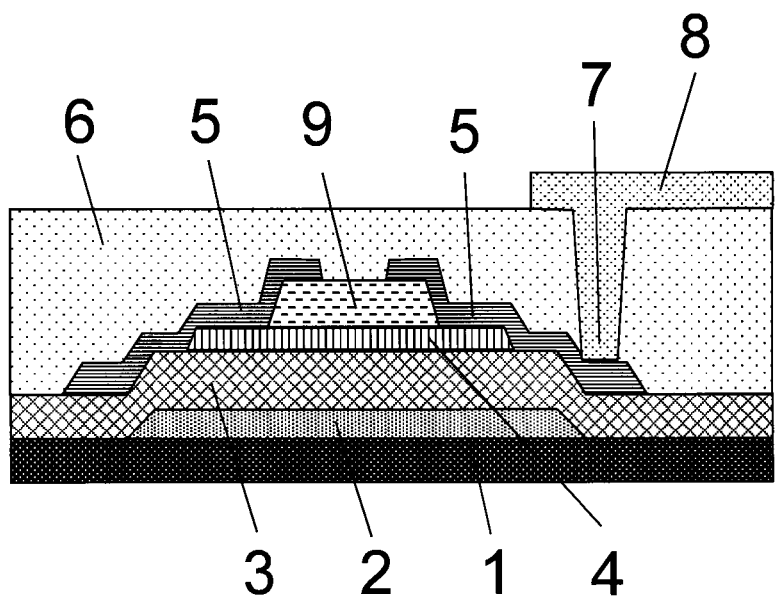

THIN FILM TRANSISTOR AND DISPLAY DEVICE

TECHNICAL FIELD

The present invention relates to a thin-film transistor (TFT) to be used in display devices such as liquid crystal displays and organic EL displays; and a display device having the thin-film transistor.

BACKGROUND ART

As compared with widely used amorphous silicon (a-Si), amorphous (non-crystalline), oxide semiconductors have high carrier mobility (also called as field-effect mobility, which may hereinafter be referred to simply as "mobility"), a wide optical band gap, and film formability at low temperatures, and therefore, have highly been expected to be applied for next generation displays, which are required to have large sizes, high resolution, and high-speed drives; resin substrates having low heat resistance; and others (see Patent Document 1).

Among the oxide semiconductors, amorphous oxide semiconductors consisting of indium, gallium, zinc and oxygen (In—Ga—Zn—O, which may hereinafter be referred to as "IGZO") have preferably been used in particular because of their very high carrier mobility. For example, non-patent literature documents 1 and 2 disclose thin film transistors (TFTs) in which a thin film of an oxide semiconductor having an In:Ga:Zn ratio equal to 1.1:1.1:0.9 (atomic % ratio) was used as a semiconductor layer (active layer).

When an oxide semiconductor is used as a semiconductor layer of a thin film transistor, the oxide semiconductor is required to have a high carrier concentration and a high mobility and excellent TFT switching properties (transistor characteristics or TFT characteristics). Specifically, the oxide semiconductor is required to have (1) a high on-state current (i.e., the maximum drain current when a positive voltage is applied to both a gate electrode and a drain electrode); (2) a low off-state current (i.e., a drain current when a negative voltage is applied to the gate electrode and a positive voltage is applied to the drain voltage, respectively); (3) a low SS value (Subthreshold Swing, i.e., a gate voltage needed to increase the drain current by one digit); (4) a stable threshold value (i.e., a voltage at which the drain current starts to flow when a positive voltage is applied to the drain electrode and either a positive voltage or a negative voltage is applied to the gate voltage, which voltage may also be called as a threshold voltage) showing no change with time (which means that the threshold voltage is uniform in the substrate surface); and (5) a high mobility.

Furthermore, TFTs using an oxide semiconductor layer such as IGZO are required to have excellent resistance to stress such as voltage application and light irradiation (stress stability). It is pointed out that, for example, when a voltage is continuously applied to the gate electrode or when light in a blue emitting band in which light absorption arises is continuously irradiated, electric charges are trapped on the boundary between the gate insulator film and the semiconductor layer of a thin film transistor, which induces a large shift of the threshold voltage toward negative side due to the change of electric charges within the semiconductor layer, resulting in a variation of switching characteristics. When a thin film transistor is used, such variation of the switching characteristics due to the stress by the voltage application and the light irradiation causes deterioration of reliability in a display devices itself.

Similarly in an organic EL display panel, the semiconductor layer is irradiated by light leaked out from a light emission layer, causing problems as a variation and a deviation of the threshold voltage in the TFT.

Such a shift of threshold voltage of the TFT particularly deteriorates the reliability of display devices such as a liquid crystal display and an organic EL display. Therefore, an improvement in the stress stability (a small variation before and after the stress tests) is eagerly desired.

Patent Document 2 is named as an example which improved electrical properties of TFT. The document discloses a technology to lower the hydrogen concentration to smaller than $6 \times 10^{20}$ atoms/cm$^3$ in an insulating film, including a gate insulator film, which is in direct contact to an oxide semiconductor layer of a channel region and to suppress diffusion of hydrogen into the oxide semiconductor layer. Diffusion of hydrogen induces excess carrier concentration in the oxide semiconductor layer and negative shift of the threshold voltage, turning the transistor normally-on state in which the drain current flows even without putting the gate bias ($V_g$=0 V), which makes the transistor faulty. The Patent Document 2 thereby describes that diffusion of hydrogen into the oxide semiconductor layer was suppressed by employing a hydrogen-reduced oxide insulating film for the insulating film which is in direct contact to the oxide semiconductor layer. The document also explains that the electrical properties of a transistor are improved because oxygen is provided from the oxide insulating film to oxygen related defects in the oxide semiconductor layer. Furthermore, according to the Patent Document 2, it is necessary to decrease the hydrogen concentration to smaller than $6 \times 10^{20}$ atoms/cm$^3$ in the insulating film in order to secure the effect. It is also stated vital to select and use hydrogen-free gas as the source gas in the process of plasma CVD of the hydrogen-reduced insulating film. In the Patent Document 2, $SiF_4$ is employed for the source gas instead of generally-used $SiH_4$. However, no attention is paid to improving stress stability, particularly decreasing the threshold voltage shift by light and electrical biasing stresses.

PRIOR ART DOCUMENTS

Patent Document

Patent Document 1: Japanese Patent Laid-open Publication No. 2011-108873
Patent Document 2: Japanese Patent Laid-open Publication No. 2012-9845

Non-Patent Literature Document

Non-patent Literature Document 1: *Kotaibutsuri* (Solid State Physics), Vol. 44, p. 621 (2009)
Non-patent Literature Document 2: Nature, Vol. 432, p. 488 (2004)

SUMMARY OF THE INVENTION

Problems to be Solved by the Invention

The present invention has been completed under the circumstances described above, and an object of the present invention is to provide a thin film transistor comprising an oxide semiconductor layer, having high stability to light and biasing stresses to have a small variation of threshold voltage, and a display device having the thin film transistor.

Means for Solving the Problems

The thin film transistor of the present invention capable to solve the problem, comprises a gate electrode, an oxide semiconductor layer comprising two or more layers configured to be used for a channel layer, an etch stopper layer configured to protect the surface of the oxide semiconductor layer, a source-drain electrode, a gate insulator film interposed between the gate electrode and the channel layer. Metal elements constituting the oxide semiconductor layer which is in direct contact to the gate insulator film are In, Zn, and Sn. Hydrogen concentration is also controlled down to 4 atomic % or smaller in the gate insulator layer which is in direct contact to the oxide semiconductor layer.

In a preferred embodiment of the present invention, the gate insulator film is a single layer structure or a laminate structure consisting two or more layers. In a case of the laminate structure, hydrogen concentration is controlled to 4 atomic % or less in a layer which is in direct contact to the oxide semiconductor layer.

In a preferred embodiment of the present invention, the oxide semiconductor layer in direct contact to the gate insulator film satisfies the requirements represented by expressions shown below, wherein [In], [Zn], and [Sn] represent the content (in atomic %) of the elements each relative to the total content of all the metal elements other than oxygen in the oxide semiconductor layer;

15≤[In]≤35, 50≤[Zn]≤60, 15≤[Sn]≤30 and the oxide semiconductor layer in direct contact to the source-drain electrode satisfies the requirements represented by expressions shown below, wherein [In], [Zn], [Sn], and [Ga] represent the content (in atomic %) of the elements each relative to the total content of all the metal elements other than oxygen in the oxide semiconductor layer;

10≤[In]≤20, 30≤[Zn]≤40, 5≤[Sn]≤15, and 35≤[Ga]≤50.

The present invention further encompasses a display device having at least one of the thin film transistors described above.

Effects of the Invention

The present invention can provide a thin film transistor having excellent switching characteristics and stress stability shown by a small variation of threshold voltage before and after applying the light irradiation and the electrically negative biasing as well as a small variation of threshold voltage before and after applying the electrically negative biasing. This is presumably because hydrogen concentration is lowered to an appropriate range in the gate insulator film which is in direct contact to the oxide semiconductor. A display device of high reliability can be provided by employing the thin film transistor of the present invention.

BRIEF DESCRIPTION OF DRAWING

FIG. 1 is a schematic cross-sectional view for explaining the thin film transistor of the present invention.

MODE FOR CARRYING OUT THE INVENTION

The present inventors have made various studies to provide a thin film transistor comprising a TFT having an oxide semiconductor active layer constituted of specific metal elements, which has excellent stress stability shown by a small variation of threshold voltage before and after applying the light irradiation and the electrically negative biasing as well as a small variation of threshold voltage before and after applying the electrically negative biasing. As a result, the present inventors have found that an intended object can be achieved by lowering the hydrogen concentration in the gate insulator film in direct contact to the oxide semiconductor film to an appropriate range. The present inventors further found that the gate insulator film in direct contact to the oxide semiconductor film can be formed at least by appropriately control deposition conditions such as for example the temperature, plasma power density, flow rate ratio of $SiH_4$ to $N_2O$ in the source gas, of the plasma CVD process, thereby completing the present invention.

The thin film transistor of the present invention comprises a gate electrode, an oxide semiconductor laminate comprising two or more layers and configured to be used for a channel layer, an etch stopper layer configured to protect the surface of the oxide semiconductor, a source-drain electrode (occasionally referred to "S/D electrode"), a gate insulator film interposed between the gate electrode and the channel layer. Metal elements constituting the oxide semiconductor layer which is in direct contact to the gate insulator film are In, Zn, and Sn. Hydrogen concentration is also controlled to 4 atomic % or smaller in the gate insulator layer which is in direct contact to the oxide semiconductor layer.

In the present specification, [In], [Zn], [Sn], and [Ga] represent the content (in atomic %) of each of the elements relative to the total content of all the metal elements (In, Zn, Sn, and Ga) other than oxygen (O).

In the present specification, the wording "excellent in stress stability" means that a thin film transistor satisfies each of the following requirements when it is subjected to (A) a negative bias temperature stress (NBTS) test in which a negative bias stress is applied onto the gate electrode for a period of 2 hours, and (B) a light and negative bias temperature stress (LNBTS) test in which white light is irradiated to the TFT while negative bias stress is applied onto the gate electrode for a period of 2 hours;

(A) the threshold voltage shift (the absolute value of $\Delta V_{th}$) is smaller than 5.0 V, after the NBTS test,
(B) the threshold voltage shift (the absolute value of $\Delta V_{th}$) is smaller than 5.0 V, the SS value is smaller than 0.55 V/decade, and decrease of the on-current (the absolute value of $\Delta I_{on}$) is smaller than 10%, after the LNBTS test.

Measurement methods of these properties are described in detail later in Examples in the specification.

In the Patent Document 2 also discloses an invention trying to improve the electrical properties by lowering hydrogen concentration in the gate insulator film. However, it is different from the present invention in the following aspects.

Firstly, there is no description on improvement of stress stability in the Patent Document 2 which refers to the threshold voltage. On the contrary, the problem to be solved in the present invention is providing a thin film transistor which is excellent in stress stability, showing small variation in the threshold voltage before and after the stress biasing, as described above. According to studies conducted by the present inventors, it was elucidated that the negative bias temperature stress (NBTS) stability is improved by lowering the amount of hydrogen contained in the gate insulator film. It was found further that the light and negative bias temperature stress (LNBTS) stability is also improved by lowering the amount of hydrogen contained in the gate insulator film. These findings are not described in the Patent Document 2.

Strictly speaking, the present invention and the Patent Document 2 are different from each other in terms of the range of hydrogen concentration in the gate insulator film. The difference is arising from the different methods of forming the gate insulator films as described in detail later in the specification. As explained above, the Patent Document 2 significantly decreased the hydrogen concentration in the gate insulator film down to smaller than $6 \times 10^{20}$ atoms/cm$^3$ (=0.667 atomic %) by employing rarely-used SiF$_4$ instead of SiH$_4$ which is generally used. The present invention, on the other hand, employs generally-used SiH$_4$ for the source gas for the deposition of the gate insulator film. The hydrogen concentration in the gate insulator film is lowered to 4 atomic % or smaller by appropriately controlling the gas flow rate ratio, the deposition temperature, the plasma power density, and so on. In fact, extreme suppression of hydrogen as in the Patent Document 2 is not appropriate because it induces excessively high deposition temperature, excessively high plasma power density, and extremely low deposition rate of the gate insulator film, causing increase in takt time in the course of fabrication process of TFT. From the practical point of view, the lower limit of the hydrogen concentration in the gate insulator film is preferably 0.667 atomic % or more which is more than the upper limit of the hydrogen concentration in the Patent Document 2.

Hereinbelow, by referring to FIG. 1, the thin film transistor (TFT) of the present invention and its preferred fabrication method re described in detail. FIG. 1 is a schematic cross sectional view for explaining one example of preferred embodiments of the present invention, but it is not intended that the present invention be limited thereto. FIG. 1, for example, shows a TFT structure of a bottom gate type; however, TFTs are not limited thereto, and TFTs may be those of a top gate type, having a gate insulator film and a gate electrode successively from the side of the substrate on an oxide semiconductor layer.

As shown in FIG. 1, a gate electrode 2 and a gate insulator film 3 are formed on the substrate 1, and an oxide semiconductor layer 4 is formed thereon in the TFT of the present embodiment. On the oxide semiconductor layer 4, a source-drain electrode 5 is formed, and a passivation film (insulating film) 6 is formed further thereon. A transparent conductive film is electrically connected to the drain electrode 5 through a contact hole 7. On the oxide semiconductor layer 4, an etch stopper layer 9 is formed to protect the surface of the oxide semiconductor layer 4.

First, a substrate is prepared. The kind of the substrate 1 is not particularly limited, and there can be used those which have widely been used in the field of display apparatus. An alkaline-free glass, a soda lime glass, or the like are exemplified. Among these, an alkaline-free glass is preferably used.

Then, a gate electrode 2 is formed on the substrate 1. The kind of the gate electrode 2 is not particularly limited, and there can be used those which have widely been used in the field of the present invention. Specifically, metals of low electrical resistivity such as Al and Cu, and refractory metals of high heat resistance such as Mo, Cr, and Ti, and their alloys, can preferably be used for the gate electrode. A method of forming the gate electrode 2 is not particularly limited, and any of the methods usually used can be employed.

Next, a gate insulator film 3 is formed. The gate insulator film 3 is interposed between the gate electrode 2 and the oxide semiconductor 4 which is configured to be used for a channel layer. The present invention is characterized in that hydrogen concentration is regulated to 4 atomic % or lower in the gate insulator film 3 which is in direct contact to the oxide semiconductor layer. It was elucidated by experimental results obtained by the present inventors that resistances to electrical biasing stress as well as stress by light irradiation and electrically negative biasing are remarkably improved by controlling the hydrogen content in the gate insulator film 3 which was in direct contact to the oxide semiconductor layer 4, as described in Examples below.

The gate insulator film 3 may consist of either a single layer or a laminate composed of two or more layers. The number of layers in the laminate structure is not particularly limited. However, considering the productivity and workability, it is preferably 3 or less.

When the gate insulator film 3 comprise a laminate structure, hydrogen concentration is to be controlled to 4 atomic % or lower in a layer which is in direct contact to an oxide semiconductor layer 4. Hydrogen concentration in a layer which is not in direct contact to the oxide semiconductor layer 4 is not particularly limited.

From the point of view to improving the stress stability, the lower hydrogen concentration in the gate insulator film 3, more preferable. It is preferably lower than or equal to 3.5 atomic %, and more preferably lower than or equal to 3 atomic %. The lower limit of the hydrogen concentration in the gate insulator film 3 is not particularly limited from the point of view on the properties. However, considering the method of forming the gate insulator film 3 explained later in the specification, it is preferably higher than 0.667 atomic % which is the upper limit of the Patent Document 2.

In the present invention, the hydrogen concentration in the gate insulator film can be decreased to the predetermined range by appropriately controlling the deposition condition of the plasma CVD method.

Specifically, deposition temperature is preferably controlled to about 250° C. or higher. When the deposition temperature is lower than 250° C., the hydrogen concentration is not sufficiently decreased, resulting in deterioration of the stress stability as demonstrated in Examples described later in the present specification. It is deduced because the density of the insulating film is decreased by the decrease of the deposition temperature, which increases Si—H bonding in the SiO$_2$ film. The deposition temperature is preferably higher than or equal to 270° C., and more preferably higher than or equal to 300° C. On the other hand, the upper limit of the deposition temperature is preferably controlled to about 450° C. or lower considering application temperature range of the apparatus used for the film formation.

The plasma power density for the deposition is preferably controlled to larger than or equal to roughly 0.6 W/cm$^2$. When the plasma power density for the deposition is lower than about 0.6 W/cm$^2$, the hydrogen concentration is not sufficiently decreased, resulting in deterioration of the stress stability as demonstrated in Examples described later in the present specification. It is deduced because the density of the insulating film is decreased by the decrease of the plasma power density, which increases Si—H bonding in the SiO$_2$ film. The plasma power density is preferably higher than or equal to 0.66 W/cm$^2$, and more preferably higher than or equal to 0.7 W/cm$^2$.

It is also preferable to control the ratio of SiH$_4$ to N$_2$O as low as possible in the gas mixture for the film deposition. In other words, the flow rate ratio (volume ratio) represented by SiH$_4$/N$_2$O is preferably controlled to a predetermined value or smaller. It is observed that the density of the SiO$_2$ film decreases when the flow rate ratio is high. It is considered that such an insulating film contains a large number of Si—H bonding.

Deposition conditions other than those described above are not particularly limited, and any of the conditions usually used can be employed.

Gas pressure, for example, is preferably controlled to about 50 to 300 Pa in order to secure stable discharge.

The gate insulator film 3 formed by the above-described method mainly comprises silicon oxide ($SiO_2$). In the meanwhile, Si—N bonding may be included as long as hydrogen content in the gate insulator film is not increased. For example, a dense silicon oxide film ($SiO_2$) having low hydrogen concentration exhibits fine insulating characteristics. However, its deposition rate is likely to be small. As such, by combining a $SiO_x$ film with a $SiN_x$ film formed at a relatively high deposition rate to constitute a laminate gate insulator film 3, both the insulating property and the productivity can be satisfied. In order to secure the insulating property, thickness of the $SiN_x$ film is preferably equal to 50 times or smaller than that of the $SiO_x$ film, and more preferably 25 times or smaller.

Subsequently, the oxide semiconductor layer 4 is formed on top of the gate insulator film 3. The oxide semiconductor layer 4 is generally interposed between the gate insulator film 3 and a source-drain electrode (S/D electrode) 5 in a thin film transistor. In the present invention, metal elements in the oxide semiconductor layer which is in direct contact to the gate insulator film 3 (sometimes referred to "oxide semiconductor on the side of the gate insulator film" hereinafter) are consisting In, Zn, and Sn, that is the oxide semiconductor layer is IZTO.

Effects of the metal elements are roughly as described below.

In increases the carrier density and enhances the mobility in the oxide semiconductor. It is noted, however, that excessive content of In turns the semiconductor to a conductor by generating excessive carriers and deteriorates the stability to the stresses.

Sn is an element effective to improve the chemical resistance such as wet etching resistance of the oxide semiconductor. However, etching workability is deteriorated when the amount of Sn is increased in the film.

It is considered that Zn contributes to stabilization of the amorphous structure. Zn contributes to the improvement of the stability of stress resistance. Excessive amount of Zn in the oxide, however, is liable to cause crystallization of the film, and occurrence of residues in the etching process.

The oxide semiconductor layer 4 may consist of a laminate composed of two or more layers. The number of layers in the laminate structure is not particularly limited. However, considering the productivity and workability, it is preferably three or less, and more preferably two.

The kind of metal elements constituting each of the layers other than the oxide semiconductor layer on the side of the gate insulator film is not particularly limited. The layers other than the oxide semiconductor layer on the side of the gate insulator film preferably contain In, Zn, and Sn.

The oxide semiconductor layer which is in direct contact to the source-drain electrode (S/D electrode) 5 (sometimes referred to "oxide semiconductor on the side of S/D electrode" hereinafter) are preferably comprising In, Zn, Sn, and Ga, which significantly improves the stress stability.

Ga is an element effective to suppress generation of oxygen deficiency, to stabilize the amorphous structure, and to improve the stress stability, particularly the stability to light and negative bias stresses, of an oxide semiconductor layer. It is noted, however, the mobility is lowered when the amount of Ga is increased in the film.

It is preferable to control the ratio of metal elements constituting the oxide semiconductor layer 4 (contents (in atomic %) of respective metal elements relative to the total amount of all the metal elements other than oxygen) to an appropriate range depending so that favorable TFT characteristics are secured.

Specifically, the metal elements constituting the oxide semiconductor layer on the side of the gate insulator film preferably satisfy the requirements represented by expressions shown below, wherein [In], [Zn], and [Sn] represent the content (in atomic %) of the elements each relative to the total content of all the metal elements other than oxygen in the oxide semiconductor layer. By satisfying the requirements, the desirable effect of each element mentioned above can be effectively exerted.

$15 \leq [In] \leq 35$, more preferably $15 \leq [In] \leq 25$,
$50 \leq [Zn] \leq 60$,
$15 \leq [Sn] \leq 30$ Further, the metal elements constituting the oxide semiconductor on the side of S/D electrode preferably satisfy the requirements represented by expressions shown below, wherein [In], [Zn], [Sn], and [Ga] represent the content (in atomic %) of the elements each relative to the total content of all the metal elements other than oxygen in the oxide semiconductor layer. By satisfying the requirements, the desirable effect of each element mentioned above can be effectively exerted.

$10 \leq [In] \leq 20$
$30 \leq [Zn] \leq 40$
$5 \leq [Sn] \leq 15$
$35 \leq [Ga] \leq 50$ The thickness of the oxide semiconductor layer 4 is preferably about 10 nm or larger, and 200 nm or smaller.

The oxide semiconductor layer 4 is preferably formed by DC sputtering or RF sputtering method using a sputtering target having the same composition as that of the thin film. Alternatively, the film formation may be carried out by a co-sputtering method, in which multiple targets with different compositions are used.

After wet etching of the oxide semiconductor layer 4, it is subjected to patterning. Immediately after the patterning, a pre-annealing heat treatment may be conducted for the purpose of improvement of film quality under the conditions, for example, of temperature: 250 to 350° C., preferably 300 to 350° C., and a duration of 15 to 120 minutes, preferably 60 to 120 minutes. The pre-annealing treatment improves the transistor performance by increasing the on-current and field-effect mobility.

Next, an etch stopper layer 9 is formed to protect the surface of the oxide semiconductor layer 4 (the surface of the oxide semiconductor on the side of S/D electrode). The etch stopper layer 9 is formed for the purpose of preventing deterioration of transistor characteristics by the wet etching of source-drain (S/D) electrode 5. The oxide semiconductor layer 4 could be damaged by the wet etching, generating defects on the surface. The kind of the etch stopper layer 9 is not particularly limited. An insulating film such as, for example, $SiO_2$ is used. The etch stopper layer 9 is formed by deposition and patterning for the purpose of protecting the surface of the channel.

Subsequently, patterning for forming electrode is carried out by photolithography and dry etching in order to secure electrical contact of the oxide semiconductor layer 4 to a source-drain electrode 5 formed successively.

Next, the source-drain electrode 5 may be formed. The kind of the source-drain electrode 5 is not particularly limited, and those which have widely been used can be employed. For example, similar to the gate electrode, metals such as Mo, Al and Cu or their alloys may be used. Alternatively, a pure Mo may be employed as in an Example explained below.

The source-drain electrode 5 may be formed by, for example, a deposition of the metal thin film by magnetron sputtering, followed by patterning by photolithography and wet etching.

The source-drain electrode 5 may be alternatively formed by a deposition of the metal thin film by magnetron sputtering, followed by patterning by lift-off method. It is possible to fabricate the electrode without a wet etching process in this method.

Then, a passivation film (an insulating film) 6 is formed on the oxide semiconductor layer 4. The passivation film 6 may be formed by, for example, a CVD method. The surface of the semiconductor layer 4 (the surface of the oxide semiconductor layer on the side of S/D electrode) may easily become conductive due to plasma-induced damage by CVD (presumably because oxygen defects formed on the surface of the first oxide semiconductor act as electron donors), and therefore, $N_2O$ plasma irradiation may be carried out before the formation of the passivation layer 6. The conditions described in the following literature may be employed as the $N_2O$ plasma irradiation conditions.

J. Park et al., Appl. Phys. Lett., 1993, 053505 (2008)

Then, by photolithography and dry etching, a contact hole 7 is formed through the passivation film 6, followed by a formation of a transparent conductive film 8. The kind of the transparent conductive film 8 is not particularly limited, and there can be used those which have usually been used such as ITO.

The present invention encompasses a display device having the TFTs as described above. As the display device, a liquid crystal display, an organic EL display, or the like are exemplified.

The present application claims the benefit of priority based on Japanese Patent Applications No. 2012-192666 and No. 2013-094087 filed on Aug. 31, 2012 and Apr. 26, 2013, respectively. The entire contents of the specification of the Japanese Patent Applications No. 2012-192666 and No. 2013-094087 filed on Aug. 31, 2012 and Apr. 26, 2013, respectively, are incorporated herein by reference.

EXAMPLES

The present invention is described hereinafter more specifically by way of Examples, but the present invention is not limited to the following Examples. The present invention can be put into practice after appropriate modifications or variations within a range meeting the gist described above and below, all of which are included in the technical scope of the present invention.

Example 1

Thin film transistors having a two-layer oxide semiconductor layer shown in FIG. 1 were fabricated as described below, and their stress stability and other characteristics were evaluated. It is noted here that a transparent conductive film 8 illustrated in FIG. 1 was not deposited in the present Example.

First, a Mo thin film of 100 nm in thickness as a gate electrode 2 and $SiO_2$ film of 250 nm in thickness as a gate insulator film 3 were successively deposited on a glass substrate 1 ("EAGLE 2000" available from Corning Inc, having a diameter of 100 mm and a thickness of 0.7 mm). The gate electrode 2 was deposited using a pure Mo sputtering target by a DC sputtering method under the conditions: deposition temperature, room temperature; sputtering power density, 3.8 $W/cm^2$; carrier gas, Ar; gas pressure, 2 mTorr; Ar gas flow rate, 20 sccm.

The gate insulator film 3 was formed by a plasma CVD method using a mixed gas of $SiH_4$ and $N_2O$ with a carrier gas. Specifically, single layers of the gate insulator film 3 were deposited on a round shape electrode of 8 inches in diameter (total area of 314 $cm^2$) as an electrode of an CVD apparatus by varying deposition temperature, plasma power density, and gas flow ratio (volume ratio) as shown in Table 1. The gas pressure was fixed at 133 Pa (not shown in the table).

Subsequently, oxide semiconductor films on the side of the gate insulator film, of various chemical compositions shown in Table 1 were deposited to a film thickness of 10 nm by a sputtering method using sputtering targets having chemical composition corresponding to each of the oxide semiconductor layer under the conditions shown below.

Sputtering apparatus: "CS-200" available from ULVAC, Inc.

Substrate temperature: room temperature

Gas pressure: 1 mTorr

Oxygen partial pressure: $100 \times O_2/(Ar+O_2)=4$ volume %

Film formation power: 2.55 $W/cm^2$

Next, oxide semiconductor films on the side of the source-drain electrode, of various chemical compositions shown in Table 1 were deposited to a film thickness of 30 nm by a sputtering method using sputtering targets having chemical composition corresponding to each of the oxide semiconductor layer under the conditions shown below.

Sputtering apparatus: "CS-200" available from ULVAC, Inc.

Substrate temperature: room temperature

Gas pressure: 1 mTorr

Oxygen partial pressure: $100 \times O_2/(Ar+O_2)=4$ volume %

Film formation power: 2.55 $W/cm^2$

The respective contents of metal elements in the oxide semiconductor layer on the side of the gate insulator film and the oxide semiconductor on the side of S/D electrode thus obtained were analyzed by an XPS (X-ray photoelectron spectroscopy) method. Specifically, after sputtering to a depth of about 5 nm from the outermost surface by Ar ion, the analysis was carried out under the conditions described below. The measurement of the oxide thin film by the XPS method was carried out using a sample having thin films each having a thickness of 100 nm formed on a Si substrate and respectively having the same compositions as the oxide semiconductor film.

X-ray source: Al $K_\alpha$.

X-ray output: 350 W

Photoelectron take-off angle: 20°

After the oxide semiconductor layer 4 (the oxide semiconductor layer on the side of the insulating film and the oxide semiconductor layer on the side of the source-drain electrode) was deposited as described above, patterning was carried out by photolithography and wet etching. "ITO-07N" available from Kanto Chemical Co., Inc., an oxalic acid-based wet etchant solution for oxide semiconductors, was used for the wet etching.

After patterning of each of the oxide semiconductor layer 4, pre-annealing treatment was carried out to improve the film quality of the oxide semiconductor layer. The pre-annealing was carried out at 350° C. under air atmosphere for 60 minutes.

Next, an etch stopper layer 9 consisting of $SiO_2$ was formed in a thickness of 100 nm to protect the surface of oxide semiconductor layer. The formation of the film was carried out by a plasma CVD method using "PD-220NL" available from SAMCO Inc. In this Example, a mixed gas of $N_2O$ and $SiH_4$ diluted in nitrogen carrier gas was used for the formation of the $SiO_2$ film under the conditions shown below.

Film formation temperature: 230° C.
Gas pressure: 133 Pa
Film formation power density: 1.1 W/cm²
Flow rate ratio (in volume ratio) of SiH₄/N₂O: 0.04.

Then, for the purpose of electrically contacting the oxide semiconductor layer 4 to the source-drain electrode 5, the etch stopper layer 9 thus obtained was subjected to patterning by photolithography and subsequent reactive ion etching (RIE).

Next, a pure Mo film was deposited as the source-drain electrode 5 by DC sputtering. Specifically, as for the gate electrode, a Mo thin film was deposited in a thickness of 100 nm. Subsequently, the source-drain electrode was patterned through photolithography.

After the source-drain electrode 5 was formed as described above, a passivation film 6 was formed to protect the oxide semiconductor layer 4. As the passivation film 6, a laminate film (250 nm in total thickness) of SiO₂ (100 nm in thickness) and SiN (150 nm in thickness) was used. The SiO₂ and SiN films were formed by plasma CVD method using "PD-220NL" available from SAMCO Inc. In the present Example, the SiO₂ film and the SiN film were successively formed. A mixed gas of N₂O and SiH₄ was used for the deposition of the SiO₂ film, and a mixed gas of SiH₄, N₂, and NH₃ was used for the deposition of the SiN film. In both cases, the film deposition power density was set to 0.32 W/cm², and the film deposition temperature was set to 150° C.

Then, a contact hole to be used for probing to evaluate transistor characteristics was formed in the passivation film 6 by photolithography and dry etching. Thus, TFTs as shown in FIG. 1 were prepared.

Each of the TFTs obtained as described above was subjected to evaluation of stress stability as follows.

(1) Evaluation of Stress Stability Under Negative Biasing (NBTS)
In the present Example, stress biasing test was carried out by applying negative bias onto the gate electrode. The stress biasing conditions are as follows.
Source voltage: 0V
Drain voltage: 10 V
Gate voltage: −20 V
Substrate temperature: 60° C.
Stress application time: 2 hours In the present Example, variation of threshold voltage during the stress biasing test for a period of 2 hours was defined as the threshold voltage shift $\Delta V_{th}$, and TFTs having a $\Delta V$th of smaller than 5.0 V in NBTS were categorized as "pass".

(2) Evaluation of Stress Stability Under Light Irradiation and Negative Biasing (LNBTS)
In the present Example, stress biasing test was carried out by applying negative bias onto the gate electrode while irradiating white light simulating a stress environment of actual liquid crystal display. The stress biasing conditions are as described below. A white LED is used for the light source simulating a back light for a liquid crystal display device.
Source voltage: 0V
Drain voltage: 10 V
Gate voltage: −20 V
Substrate temperature: 60° C.
Stress application time: 2 hours
Light source: white LED (LXHL-PW01 available from PHILIPS N.V.) 25000nit In the present Example, variation of threshold voltage during the stress biasing test for a period of 2 hours was defined as the threshold voltage shift $\Delta V_{th}$, and TFTs having a $\Delta V_{th}$ of smaller than 5.0 V in LNBTS were categorized as "pass".

(3) Measurement of SS Value
SS value is a minimum value of a gate voltage needed to increase the drain current by one digit. In the present Example TFTs having a SS value of smaller than 0.55 V/decade in the LNBTS stress test were categorized as "pass".

(4) Measurement of on-Current ($I_{on}$)
On-current ($I_{on}$) is a value of drain current measured at the gate bias of 30 V when the transistor is on-state. In the present Example, the on-currents were measured before and after the (2) LNBTS stress test, and when their difference in absolute value ($\Delta I_{on}$) is smaller than 10%, the TFT was categorized "A" or "pass", while those having $\Delta I_{on}$ of 10% or larger were categorized "B" or "fail".

The results are summarized in Table 1. Each gas flow ratio (volume ratio) in the Table indicates ratio of SiH₄ where the flow rate of N₂O is 100.

The rightmost column in each of the tables is for total evaluation, and each sample was rated "A" if it satisfies all of the criteria explained above, and rated "B" if it fails to satisfy at least one of the criteria.

TABLE 1

| No. | Metal element ratio in oxide semiconductor on the side of S/D electrode | | | | Metal element ratio in oxide semiconductor on the side of gate insulator film | | | Conditions for forming the gate insulator film | | | | |
|---|---|---|---|---|---|---|---|---|---|---|---|---|
| | In (atomic %) | Ga (atomic %) | Zn (atomic %) | Sn (atomic %) | In (atomic %) | Zn (atomic %) | Sn (atomic %) | Temp. (° C.) | Input power (W) | (W/cm²) | Gas flow ratio SiH₄ | N₂O |
| 1 | 12.0 | 40.0 | 34.0 | 14.0 | 20 | 56.7 | 23.3 | 320 | 300 | 0.96 | 2.24 | 100 |
| 2 | 12.0 | 40.0 | 34.0 | 14.0 | 20 | 56.7 | 23.3 | 320 | 300 | 0.96 | 4 | 100 |
| 3 | 12.0 | 40.0 | 34.0 | 14.0 | 20 | 56.7 | 23.3 | 300 | 300 | 0.96 | 4 | 100 |
| 4 | 12.0 | 40.0 | 34.0 | 14.0 | 30 | 56.7 | 23.3 | 250 | 300 | 0.96 | 4 | 100 |
| 5 | 12.0 | 40.0 | 34.0 | 14.0 | 30 | 51.7 | 18.3 | 300 | 250 | 0.80 | 4 | 100 |
| 6 | 12.0 | 40.0 | 34.0 | 14.0 | 30 | 51.7 | 18.3 | 300 | 100 | 0.32 | 4 | 100 |
| 7 | 11.0 | 45.0 | 31.2 | 12.8 | 20 | 56.7 | 23.3 | 320 | 300 | 0.96 | 2.24 | 100 |
| 8 | 11.0 | 45.0 | 31.2 | 12.8 | 20 | 56.7 | 23.3 | 320 | 300 | 0.96 | 4 | 100 |
| 9 | 11.0 | 45.0 | 31.2 | 12.8 | 30 | 51.7 | 18.3 | 300 | 300 | 0.96 | 4 | 100 |
| 10 | 11.0 | 45.0 | 31.2 | 12.8 | 30 | 51.7 | 18.3 | 250 | 300 | 0.96 | 4 | 100 |
| 11 | 10.0 | 50.0 | 28.4 | 11.7 | 20 | 56.7 | 23.3 | 300 | 250 | 0.80 | 4 | 100 |

TABLE 1-continued

| No. | | | | | | | | | | | | |
|---|---|---|---|---|---|---|---|---|---|---|---|---|
| 12 | 10.0 | 50.0 | 28.4 | 11.7 | 30 | 51.7 | 18.3 | 300 | 100 | 0.32 | 4 | 100 |
| 13 | 17.0 | 17.0 | 47.0 | 19.0 | 20 | 56.7 | 23.3 | 300 | 300 | 0.96 | 4 | 100 |

| | Hydrogen content in | LNBTS | | | NBTS | |
|---|---|---|---|---|---|---|
| No. | gate insulator film (atomic %) | $\Delta V_{th}$ (V) | $\Delta I_{on}$ (A) | SS value (V/decade) | $\Delta V_{th}$ (V) | Evaluation |
| 1 | 1.2 | 0.5 | A | 0.30 | 0.3 | A |
| 2 | 1.2 | 0.5 | A | 0.28 | 0.3 | A |
| 3 | 1.5 | 1.0 | A | 0.33 | 0.5 | A |
| 4 | 3.0 | 4.0 | A | 0.40 | 1.0 | A |
| 5 | 3.5 | 4.5 | A | 0.45 | 1.3 | A |
| 6 | 8.0 | 10.0 | B | 0.80 | 5.0 | B |
| 7 | 1.2 | 0.5 | A | 0.30 | 0.3 | A |
| 8 | 1.2 | 0.5 | A | 0.28 | 0.3 | A |
| 9 | 1.5 | 2.8 | A | 0.33 | 0.5 | A |
| 10 | 3.0 | 3.8 | A | 0.40 | 1.0 | A |
| 11 | 3.5 | 4.5 | A | 0.45 | 1.3 | A |
| 12 | 8.0 | 9.0 | B | 0.80 | 5.0 | B |
| 13 | 1.5 | 3.5 | A | 0.45 | 3.0 | A |

The results shown in Table 1 may be analyzed as follows.

Shown in Table 1 are results of the evaluation conducted for samples prepared having IZTO as the oxide semiconductor layer on the side of the insulating film and IGZTO as the oxide semiconductor layer on the side of S/D electrode in various ratios of metal elements constituting the oxide semiconductor layer and a variety of deposition conditions including deposition temperature, plasma power density, and gas flow ratio for the gate insulator film.

Consequently, excellent properties were secured in every stress test as the hydrogen concentration in the gate insulator film is lowered to the specified range in the examples (Nos. 1 to 5, 7 to 11, and 27) for which the deposition conditions of the gate insulator film were controlled to; deposition temperature of 250° C. or higher, plasma power density of 0.7 W/cm² or higher, and gas flow rate ratio ($SiH_4/N_2O$) of 0.04 or lower. In addition these samples showed high mobility of 6 cm²/Vs or higher (Mobility for each sample is not shown in the tables).

On the contrary, when the plasma power density for the formation of the gate insulator film was out of the preferred conditions, desirable properties in terms of stress stability were not secured (Nos. 6 and 12).

EXPLANATION OF REFERENCE NUMERALS

1 Substrate
2 Gate electrode
3 Gate insulator film
4 Oxide semiconductor layer
5 Source-drain electrode
6 Passivation film (insulating film)
7 Contact hole
8 Transparent conductive film
9 Etch stopper layer

The invention claimed is:

1. A thin film transistor, comprising:
a gate electrode,
an oxide semiconductor layer comprising at least a first and a second oxide semiconductor layer,
an etch stopper layer,
a source-drain electrode, and
a gate insulator film,
wherein
the oxide semiconductor layer is configured to be a channel layer;
the etch stopper layer is configured to protect a surface of the oxide semiconductor layer;
the gate insulator film is interposed between the gate electrode and the channel layer;
the first oxide semiconductor layer is in direct contact to the gate insulator film and satisfies the following expressions:
15≤[In]≤35, 50≤[Zn]≤60, 15≤[Sn]≤30
where [In], [Zn], and [Sn] represent a content of each element in atomic % relative to a total content of all metal elements in the first oxide semiconductor layer;
a hydrogen concentration in the gate insulator film in direct contact to the first oxide semiconductor layer is 4 atomic % or lower; and
the second oxide semiconductor layer is in direct contact to the source-drain electrode and satisfies the following expressions:
10≤[In]≤20, 30≤[Zn]≤40, 5≤[Sn]≤15, and 35≤[Ga]≤50
where [In], [Zn], [Sn], and [Ga] represent a content of each element in atomic % relative to a total content of all metal elements in the second oxide semiconductor layer.

2. The thin film transistor according to claim 1, wherein the gate insulator film is a single layer structure or a laminate structure comprising two or more layers;
in case of the laminate structure, the hydrogen concentration is 4 atomic % or less in a layer which is in direct contact to the first oxide semiconductor layer.

3. A display device, comprising the thin film transistor according to claim 1.

4. The thin film transistor according to claim 1, wherein the hydrogen concentration in the gate insulator film in direct contact to the first oxide semiconductor layer is 3.5 atomic % or lower.

5. The thin film transistor according to claim 1, wherein the hydrogen concentration in the gate insulator film in direct contact to the first oxide semiconductor layer is 3 atomic % or lower.

6. The thin film transistor according to claim 1, wherein the hydrogen concentration in the gate insulator film in direct contact to the first oxide semiconductor layer is 0.667 atomic % or more.

* * * * *